(12) United States Patent
Nagaoka et al.

(10) Patent No.: US 11,842,926 B2
(45) Date of Patent: Dec. 12, 2023

(54) METHOD OF PROCESSING A SUBSTRATE

(71) Applicant: DISCO Corporation, Tokyo (JP)

(72) Inventors: Kensuke Nagaoka, Munich (DE); Yasuyoshi Yubira, Munich (DE)

(73) Assignee: DISCO CORPORATION, Tokyo (JP)

( * ) Notice: Subject to any disclaimer, the term of this patent is extended or adjusted under 35 U.S.C. 154(b) by 205 days.

(21) Appl. No.: 17/393,843

(22) Filed: Aug. 4, 2021

(65) Prior Publication Data

US 2022/0044970 A1 Feb. 10, 2022

(30) Foreign Application Priority Data

Aug. 10, 2020 (DE) ...................... 10 2020 210 104.3

(51) Int. Cl.
*H01L 21/78* (2006.01)
*H01L 21/683* (2006.01)

(52) U.S. Cl.
CPC .......... *H01L 21/78* (2013.01); *H01L 21/6836* (2013.01); *H01L 2221/68336* (2013.01)

(58) Field of Classification Search
CPC ................. H01L 21/78; H01L 21/6836; H01L 2221/68336; H01L 2221/68327; B23K 26/53
See application file for complete search history.

(56) References Cited

U.S. PATENT DOCUMENTS

| 10,658,240 | B1 * | 5/2020 | Iriguchi | .................. H01L 24/09 |
| 2007/0085099 | A1 | 4/2007 | Fukumitsu et al. | |
| 2010/0015784 | A1 * | 1/2010 | Nakamura | ........... B23K 26/042 438/464 |
| 2014/0250102 | A1 | 9/2014 | Dai et al. | |
| 2014/0315372 | A1 | 10/2014 | Nakamura | |
| 2016/0104643 | A1 | 4/2016 | Yamashita et al. | |
| 2017/0062278 | A1 * | 3/2017 | Priewasser | .......... H01L 21/6836 |
| 2017/0162521 | A1 | 6/2017 | Nakamura | |
| 2018/0005862 | A1 * | 1/2018 | Priewasser | ............ H01L 21/304 |

(Continued)

FOREIGN PATENT DOCUMENTS

| JP | 49037564 A | 4/1974 |
| JP | 2010177277 A | 8/2010 |
| JP | 2014229702 A | 12/2014 |

(Continued)

OTHER PUBLICATIONS

Office action issued in parallel Japanese patent application JP 2021-129713, dated Nov. 22, 2022.

*Primary Examiner* — Brian Turner
(74) *Attorney, Agent, or Firm* — Greer Burns & Crain Ltd.

(57) ABSTRACT

This invention relates to a method of processing a substrate, having on one side a device area with a plurality of devices. The method includes attaching a first protective film to the one side of the substrate, so that at least a central area of a front surface of the first protective film is in direct contact with the one side of the substrate, and attaching a second protective film to the opposite side of the substrate. After attaching the second protective film, a laser beam is applied to the substrate from the opposite side of the substrate. The substrate and second protective film are transparent to the laser beam. The laser beam is applied to the substrate in a plurality of positions so as to form a plurality of modified regions in the substrate.

13 Claims, 6 Drawing Sheets

(56) References Cited

U.S. PATENT DOCUMENTS

2019/0252254 A1    8/2019   Priewasser et al.
2020/0066569 A1    2/2020   Priewasser et al.

FOREIGN PATENT DOCUMENTS

| | | |
|---|---|---|
| JP | 2017152569 A | 8/2017 |
| JP | 2019016731 A | 1/2019 |
| JP | 2019140387 A | 8/2019 |
| TW | 201724243 A | 7/2017 |
| TW | 201728640 A | 8/2017 |
| TW | 201933513 A | 8/2019 |

* cited by examiner ated by the adhesive layer formed on the protective film or sheeting or may be contaminated by adhesive residues on the devices when the film or sheeting is peeled off from the substrate. This applies, in particular, if fragile and/or sensitive structures, e.g., sensitive devices, such as micro-electro-mechanical systems (MEMS), are present on the substrate front side.
METHOD OF PROCESSING A SUBSTRATE

TECHNICAL FIELD

The present invention relates to a method of processing a substrate, such as a wafer, e.g., a semiconductor wafer, having on one side a device area with a plurality of devices.

TECHNICAL BACKGROUND

In a device fabrication process, e.g., a semiconductor device fabrication process, a substrate, such as a wafer, having a device area with a plurality of devices, commonly partitioned by a plurality of division lines, is divided into individual dies. The device fabrication process generally comprises a cutting step of cutting the substrate, e.g., along the division lines, to obtain the individual dies. Moreover, also other processing steps, such as grinding and/or polishing and/or etching, may be carried out on a back side of the substrate which is opposite to a substrate front side on which the device area is formed.

The substrate may be cut, e.g., along the division lines, from its front side or its back side. In particular, the substrate may be cut by mechanical cutting, e.g., by blade dicing or sawing, by plasma cutting or by laser cutting. Laser cutting may be performed, for example, by ablation laser cutting and/or by stealth laser cutting, i.e., by forming modified regions within the substrate by the application of a laser beam, and/or by forming a plurality of hole regions in the substrate by the application of a laser beam.

When conventional mechanical cutting or laser cutting, in particular, stealth laser cutting, is performed from the substrate front side, the problem may arise that debris generated in the cutting process damages or contaminates the devices formed in the device area. This problem is particularly pronounced if the substrate comprises, on its front side, fragile and/or sensitive structures, e.g., in the device area, and/or metal structures, e.g., within the division lines.

In particular, there is commonly a problem in that a laser beam to be used for stealth laser cutting cannot be transmitted through such metal structures formed on the division lines, rendering a stealth dicing process from the substrate front side unfeasible. Hence, the laser beam has to be applied to the substrate from its back side, as will be detailed in the following.

In order to protect the devices formed in the device area from damage and contamination by such debris, a protective film or sheeting may be applied to the front side of the substrate prior to processing, and mechanical cutting or laser cutting, in particular, stealth laser cutting, may be performed from the substrate back side. In particular, when processing the substrate from its back side in such a manner, the substrate is commonly placed on a support, such as a chuck table, with its front side contacting the support. The protective film or sheeting applied to the substrate front side protects the devices from damage, e.g., mechanical damage, due to the contact with the support. However, in this case, there is a problem in that the device structure on the substrate may be damaged by the adhesive force of an adhesive layer formed on the protective film or sheeting or may be contaminated by adhesive residues on the devices when the film or sheeting is peeled off from the substrate. This applies, in particular, if fragile and/or sensitive structures, e.g., sensitive devices, such as micro-electro-mechanical systems (MEMS), are present on the substrate front side. For example, MEMS membranes may be damaged, e.g., broken, when peeling off the protective film or sheeting from the substrate.

In order to reduce the risk of damage to and contamination of the devices formed in the device area by the adhesive layer, it has been proposed to apply the adhesive layer only to a peripheral portion of the protective film or sheeting. However, in this case, it can be difficult to reliably hold the substrate during processing since the protective film or sheeting may not provide sufficient support to the substrate in a central portion of the film or sheeting which is surrounded by the peripheral portion thereof. This issue is aggravated for the case of substrates with fragile and/or sensitive structures on their front sides. For example, if the substrate front side comprises MEMS, e.g., with thin membranes or cavities, no pressure and/or heat can be applied to the protective film or sheeting during and/or after attaching it to the substrate due to the risk of damaging these fragile structures.

Further, when cutting the substrate by stealth laser cutting, the issue of substrate warpage may arise. Specifically, when forming modified regions within the substrate by the application of a laser beam, the substrate volume may be increased in these regions, resulting in the generation of stress and, thus, bending or warpage of the substrate. This applies, in particular, if a large number of modified regions is formed in the substrate, e.g., when stealth laser cutting a substrate having a plurality of small-size devices formed on its front side. For the case of using a protective film or sheeting with an adhesive layer applied only to its peripheral portion, the substrate may not be sufficiently supported by the film or sheeting to suppress this substrate warpage. The substrate warpage may affect the accuracy with which the modified regions can be formed within the substrate, thus compromising the division of the substrate into individual dies. For example, some of the dies may not be properly separated from each other and/or be damaged in the substrate division process. This problem is particularly pronounced for the case of small die sizes.

Hence, there remains a need for a reliable and efficient method of processing a substrate having a device area which allows for any risk of contamination of and damage to the substrate to be minimised.

SUMMARY OF THE INVENTION

Accordingly, it is an object of the present invention to provide a reliable and efficient method of processing a substrate having a device area which allows for any risk of contamination of and damage to the substrate to be minimised. This goal is achieved by a substrate processing method with the technical features of claim 1. Preferred embodiments of the invention follow from the dependent claims.

The invention provides a method of processing a substrate, having on one side a device area with a plurality of devices. The method comprises providing a first protective film or sheet, providing a second protective film or sheet, attaching the first protective film or sheet to the one side of the substrate, so that at least a central area of a front surface of the first protective film or sheet is in direct contact with the one side of the substrate, and attaching the second protective film or sheet to a side of the substrate being opposite to the one side. After attaching the second protective film or sheet to the side of the substrate being opposite to the one side, a laser beam is applied to the substrate from the side of the substrate being opposite to the one side. The substrate is made of a material which is transparent to the laser beam. The second protective film or sheet is made of a material which is transparent to the laser beam. The laser beam is applied to the substrate in a plurality of positions so as to form a plurality of modified regions in the substrate.

The first protective film, for covering the devices formed in the device area, is attached to the one side of the substrate, i.e., to the substrate front side, so that at least the central area of the front surface of the first protective film is in direct contact with the one side of the substrate. Thus, no material, in particular, no adhesive, is present between at least the central area of the front surface of the first protective film and the one side of the substrate.

Therefore, the risk of a possible contamination of or damage to the substrate, e.g., due to an adhesive force of an adhesive layer or adhesive residues on the substrate, can be significantly reduced or even eliminated.

The second protective film is attached to the side of the substrate being opposite to the one side, i.e., to the substrate back side. The second protective film is made of a material which is transparent to the laser beam. Thus, the laser beam has a wavelength that allows transmission of the laser beam through the second protective film. Hence, after attaching the second protective film to the substrate back side, a plurality of modified regions can be formed in the substrate by applying the laser beam to the substrate from its back side through the second protective film. During this application of the laser beam to the substrate, the substrate can be reliably supported by the second protective film attached thereto. Therefore, any warpage of the substrate during processing can be suppressed or even entirely prevented, allowing for the accuracy with which the modified regions can be formed within the substrate to be significantly enhanced. For example, the modified regions can be consistently formed at the same depth inside the substrate, i.e., at the same position along the thickness direction of the substrate. The thickness direction of the substrate extends from the substrate front side towards the substrate back side. Thus, the substrate can be processed in a particularly efficient manner. In particular, the accurate formation of the modified regions within the substrate allows for a reliable division of the substrate into individual dies, also for the case of small die sizes.

The method of the present invention thus enables reliable and efficient processing of a substrate having a device area, minimising any risk of contamination of and damage to the substrate, in particular, the devices formed in the device area.

The substrate may be, for example, made of a semiconductor, glass, sapphire ($Al_2O_3$), a ceramic, such as an alumina ceramic, quartz, zirconia, PZT (lead zirconate titanate), a polycarbonate, a metal (e.g., copper, iron, stainless steel, aluminium or the like) or metalised material, a ferrite, an optical crystal material, a resin or the like.

In particular, the substrate may be, for example, made of silicon carbide (SiC), silicon (Si), gallium arsenide (GaAs), gallium nitride (GaN), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like.

The substrate may be a single crystal substrate, a glass substrate, a compound substrate, such as a compound semiconductor substrate, or a polycrystalline substrate, such as a ceramic substrate.

The substrate may be a wafer, in particular, a semiconductor wafer. For example, the substrate may be a silicon carbide (SiC) wafer, a silicon (Si) wafer, a gallium arsenide (GaAs) wafer, a gallium nitride (GaN) wafer, a gallium phosphide (GaP) wafer, an indium arsenide (InAs) wafer, an indium phosphide (InP) wafer, a silicon nitride (SiN) wafer, a lithium tantalate (LT) wafer, a lithium niobate (LN) wafer, an aluminium nitride (AlN) wafer, a silicon oxide ($SiO_2$) wafer or the like.

The substrate may be made of a single material or of a combination of different materials, e.g., two or more of the above-identified materials. For example, the substrate may be a Si and glass bonded substrate, e.g., a Si and glass bonded wafer, in which a substrate element made of Si is bonded to a substrate element made of glass.

The substrate may have any type of shape. In a top view thereon, the substrate may have, for example, a circular shape, an oval shape, an elliptical shape or a polygonal shape, such as a rectangular shape or a square shape.

The devices in the device area on the one side of the substrate may be, for example, semiconductor devices, power devices, optical devices, medical devices, electrical components, MEMS devices or combinations thereof. The devices may comprise or be, for example, transistors, such as MOSFETs or insulated-gate bipolar transistors (IGBTs), or diodes, e.g., Schottky barrier diodes.

The substrate may further have, on the one side thereof, a peripheral marginal area having no devices and being formed around the device area.

The first protective film may be made of a single material, in particular, a single homogeneous material. The first protective film may be a solid sheet of material. For example, the first protective film may be a foil or a sheeting.

The first protective film may be made of a plastic material, such as a polymer. Particularly preferably, the first protective film is made of a polyolefin. For example, the first protective film may be made of polyethylene (PE), polypropylene (PP) or polybutylene (PB).

Polyolefin films have material properties which are especially advantageous for use in the substrate processing method of the present invention, in particular, if applying an external stimulus to the first protective film comprises or consists of heating the first protective film, as will be described in detail below. Polyolefin films are pliable, stretchable and soft when in a heated state, e.g., when heated to a temperature in the range of 60° C. to 150° C. Further, polyolefin films harden and stiffen upon cooling down, so as to become more rigid and robust in the cooled down state. Hence, particularly reliable protection of the substrate during subsequent processing of the substrate can be ensured.

The first protective film may have a thickness in the range of 5 to 500 μm, preferably 5 to 200 μm, more preferably 8 to 100 μm, even more preferably 10 to 80 μm and yet even more preferably 12 to 50 μm. Particularly preferably, the first protective film has a thickness in the range of 80 to 150 μm.

The first protective film may have any type of shape. In a top view thereon, the first protective film may have, for example, a circular shape, an oval shape, an elliptical shape or a polygonal shape, such as a rectangular shape or a square shape.

The first protective film may have substantially the same shape or the same shape as the substrate.

The first protective film may have an outer diameter which is larger than an outer diameter of the substrate. In this way, processing, handling and/or transport of the substrate can be facilitated. In particular, an outer peripheral portion of the first protective film can be attached to an annular frame, as will be detailed below.

The first protective film may have an outer diameter which is smaller than the outer diameter of the substrate.

The first protective film may have an outer diameter which is substantially the same as the outer diameter of the substrate.

The first protective film may have an outer diameter which is substantially the same as an outer diameter of the device area formed on the one side of the substrate.

The second protective film may be made of a single material, in particular, a single homogeneous material. The second protective film may be a solid sheet of material. For example, the second protective film may be a foil or a sheeting.

The second protective film may be made of a plastic material, such as a polymer. Particularly preferably, the second protective film is made of a polyolefin. For example, the second protective film may be made of polyethylene (PE), polypropylene (PP) or polybutylene (PB).

Using a second protective film which is made of a polyolefin is particularly advantageous if applying an external stimulus to the second protective film comprises or consists of heating the second protective film, as will be described in detail below.

The second protective film may have a thickness in the range of 5 to 500 µm, preferably 5 to 200 µm, more preferably 8 to 100 µm, even more preferably 10 to 80 µm and yet even more preferably 12 to 50 µm. Particularly preferably, the second protective film has a thickness in the range of 80 to 150 µm.

The second protective film may have any type of shape. In a top view thereon, the second protective film may have, for example, a circular shape, an oval shape, an elliptical shape or a polygonal shape, such as a rectangular shape or a square shape.

The second protective film may have substantially the same shape or the same shape as the substrate. The second protective film may have substantially the same shape or the same shape as the first protective film.

The second protective film may have an outer diameter which is larger than the outer diameter of the substrate. In this way, processing, handling and/or transport of the substrate can be facilitated. In particular, an outer peripheral portion of the second protective film can be attached to an annular frame, as will be detailed below.

The second protective film may have an outer diameter which is smaller than the outer diameter of the substrate.

The second protective film may have an outer diameter which is substantially the same as the outer diameter of the substrate.

The second protective film may have an outer diameter which is substantially the same as an outer diameter of the device area formed on the one side of the substrate.

The second protective film may have an outer diameter which is substantially the same as the outer diameter of the first protective film.

The laser beam applied to the substrate from its back side may be a pulsed laser beam. The pulsed laser beam may have a pulse width, for example, in the range of 1 fs to 2000 ns.

The substrate is made of a material which is transparent to the laser beam, e.g., the pulsed laser beam. Thus, the plurality of modified regions is formed in the substrate by the application of a laser beam having a wavelength that allows transmission of the laser beam through the substrate. For example, if the substrate is a Si substrate, e.g., a Si wafer, the laser beam may have a wavelength of 1.0 µm or more.

The laser beam, e.g., the pulsed laser beam, may be applied to the substrate in the plurality of positions in a condition where a focal point of the laser beam is located at a distance from the side of the substrate being opposite to the one side in the direction from the side of the substrate being opposite to the one side towards the one side of the substrate, so as to form the plurality of modified regions in the substrate. Alternatively, the laser beam may be applied to the substrate in the plurality of positions in a condition where the focal point of the laser beam is located at a distance from the side of the substrate being opposite to the one side in a direction opposite to the direction from the side of the substrate being opposite to the one side towards the one side of the substrate, so as to form the plurality of modified regions in the substrate. The laser beam may be applied to the substrate in the plurality of positions in a condition where the focal point of the laser beam is located at the side of the substrate being opposite to the one side, so as to form the plurality of modified regions in the substrate. The laser beam may be applied to the substrate in the plurality of positions in a condition where the focal point of the laser beam is located within the bulk of the substrate, so as to form the plurality of modified regions in the substrate.

The modified regions are regions of the substrate which have been modified by the application of the laser beam. The modified regions may be regions of the substrate in which the structure of the substrate material has been modified. The modified regions may be regions of the substrate in which the substrate has been damaged.

By forming these modified regions, the strength of the substrate in the areas thereof where the modified regions are formed is reduced. Hence, division of the substrate along the areas thereof where the plurality of modified regions has been formed is greatly facilitated. In such a substrate division process, the individual devices provided in the device area of the substrate are obtained as chips or dies.

The modified regions may comprise amorphous regions and/or regions in which cracks are formed. The modified regions may be amorphous regions and/or regions in which cracks are formed. In particularly preferred embodiments, the modified regions comprise or are amorphous regions.

Each modified region may comprise a space, e.g., a cavity, inside the substrate material, the space being surrounded by an amorphous region and/or a region in which cracks are formed.

Each modified region may be composed of a space, e.g., a cavity, inside the substrate material and an amorphous region and/or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the µm range. For example, the cracks may have widths in the range of 5 µm to 100 µm and/or lengths in the range of 100 µm to 1000 µm.

In the method of the present invention, attaching the first protective film to the one side of the substrate may comprise applying the first protective film to the one side of the substrate, so that at least the central area of the front surface of the first protective film is in direct contact with the one side of the substrate. Thus, no material, in particular, no adhesive, is present between at least the central area of the front surface of the first protective film and the one side of the substrate. Further, attaching the first protective film to the one side of the substrate may comprise applying an external stimulus to the first protective film during and/or after applying the first protective film to the one side of the substrate, so that the first protective film is attached to the one side of the substrate. An attachment force between first protective film and substrate, holding the first protective film in its position on the substrate, is thus generated through the application of the external stimulus. Hence, no additional adhesive material is necessary for attaching the first protective film to the one side of the substrate.

In particular, by applying the external stimulus to the first protective film, a form fit, such as a positive fit, and/or a material bond, such as an adhesive bond, may be formed between the first protective film and the substrate. The terms "material bond" and "adhesive bond" define an attachment or connection between first protective film and substrate due to atomic and/or molecular forces acting between these two components.

The term "adhesive bond" relates to the presence of these atomic and/or molecular forces, which act so as to attach or adhere the first protective film to the substrate, and does not imply the presence of an additional adhesive between first protective film and substrate. Rather, at least the central area of the front surface of the first protective film is in direct contact with the one side of the substrate, as has been detailed above.

The substrate front side surface may be a substantially flat, even surface. Alternatively, protrusions or projections protruding from a plane substrate surface along the thickness direction of the substrate and/or recesses, such as trenches, grooves, cuts or the like, extending inwards from the plane substrate surface may be present on the front side of the substrate. The first protective film may be attached to the one side of the substrate so as to at least partly follow the contours or the topography of the one side of the substrate, e.g., the contours of protrusions or projections and/or recesses present on this substrate side.

The first protective film may be expandable.

The first protective film may be expanded when being applied to the one side of the substrate. In particular, the first protective film may be expanded when being applied to the one side of the substrate so as to at least partly follow the contours or the topography of the one side of the substrate, e.g., the contours of protrusions or projections and/or recesses present on this substrate side.

For example, the first protective film may be expandable to twice its original size or more, preferably three times its original size or more and more preferably four times its original size or more. In this way, in particular, for the case of an expansion to three or four times its original size or more, it can be especially reliably ensured that the first protective film follows the contours or the topography of the one side of the substrate.

If the first protective film is expandable it may be used for separating the devices from each other, as will be described in detail below.

Applying the external stimulus to the first protective film may comprise or consist of applying pressure to the first protective film and/or heating the first protective film and/or cooling the first protective film and/or applying a vacuum to the first protective film and/or irradiating the first protective film with radiation, such as light, e.g., by using a laser beam. For example, the radiation may comprise or be UV radiation.

The external stimulus may comprise or be a chemical compound and/or electron or plasma irradiation and/or mechanical treatment, such as pressure, friction or ultrasound application, and/or static electricity.

In some embodiments, applying the external stimulus to the first protective film comprises or consists of applying pressure to the first protective film, e.g., by using a pressure application means, such as a roller, a stamp, a membrane or the like. Alternatively, the first protective film may be attached to the one side of the substrate without applying pressure to the first protective film, e.g., by just placing the first protective film on the one side of the substrate. The first protective film may be attached to the one side of the substrate without applying heat to the first protective film. The first protective film may be attached to the one side of the substrate without applying a vacuum to the first protective film. The first protective film may be attached to the one side of the substrate without applying pressure to the first protective film, without applying heat to the first protective film and without applying a vacuum to the first protective film. This latter approach is particularly advantageous if very fragile and/or sensitive structures, e.g., very sensitive devices, such as micro-electro-mechanical systems (MEMS), are present on the substrate front side.

For example, applying the external stimulus to the first protective film may comprise or consist of applying pressure to the first protective film and applying a vacuum to the first protective film. The vacuum may be applied to the first protective film in a vacuum chamber. Alternatively, the first protective film may be attached to the one side of the substrate without applying a vacuum to the first protective film.

In some embodiments, applying the external stimulus to the first protective film comprises or consists of heating the first protective film. For example, applying the external stimulus to the first protective film may comprise or consist of heating the first protective film and applying a vacuum to the first protective film. In this case, the vacuum may be applied to the first protective film during and/or before and/or after heating the first protective film.

If applying the external stimulus to the first protective film comprises or consists of heating the first protective film, the method may further comprise allowing the first protective film to cool down after the heating process. In particular, the first protective film may be allowed to cool down to its initial temperature, i.e., to the temperature thereof prior to the heating process. The first protective film may be allowed to cool down, e.g., to its initial temperature, before applying the laser beam to the substrate.

An attachment force between first protective film and substrate is generated through the heating process. The attachment of the first protective film to the substrate may be caused in the heating process itself and/or in a subsequent process of allowing the first protective film to cool down.

The first protective film may be softened by the heating process, e.g., so as to conform to the substrate surface on the one side of the substrate, for example, absorbing the substrate topography. Upon cooling down, e.g., to its initial temperature, the first protective film may reharden, e.g., so as to create a form fit and/or a material bond to the substrate.

The first protective film may be heat resistant up to a temperature of 180° C. or more, preferably up to a temperature of 220° C. or more, more preferably up to a temperature of 250° C. or more, and even more preferably up to a temperature of 300° C. or more.

The first protective film may be heated to a temperature in the range of 30° C. to 250° C., preferably 50° C. to 200° C., more preferably 60° C. to 150° C. and even more preferably 70° C. to 110° C. Particularly preferably, the first protective film is heated to a temperature of approximately 80° C.

The first protective film may be heated over a duration in the range of 30 sec to 10 min, preferably 1 min to 8 min, more preferably 1 min to 6 min, even more preferably 1 min to 4 min and yet more preferably 1 min to 3 min, during and/or after applying the first protective film to the one side of the substrate.

If applying the external stimulus to the first protective film comprises or consists of heating the first protective film, the first protective film may be directly and/or indirectly heated.

The first protective film may be heated by directly applying heat thereto, e.g., using a heat application means, such as a heated roller, a heated stamp or the like, or a heat radiation means. By using a combined heat and pressure application means, such as a heated roller or a heated stamp, pressure can be applied to the first protective film while, at the same time, heating the first protective film. The first protective film and the substrate may be placed in a receptacle or chamber, such as a vacuum chamber, and an inner volume of the receptacle or chamber may be heated, so as to heat the first protective film. The receptacle or chamber may be provided with a heat radiation means.

The first protective film may be indirectly heated, e.g., by heating the substrate before and/or during and/or after applying the first protective film to the one side of the substrate. For example, the substrate may be heated by placing the substrate on a support or carrier, such as a chuck table, and heating the support or carrier.

For example, the support or carrier, such as a chuck table, may be heated to a temperature in the range of 30° C. to 250° C., preferably 50° C. to 200° C., more preferably 60° C. to 150° C. and even more preferably 70° C. to 110° C. Particularly preferably, the support or carrier may be heated to a temperature of approximately 80° C.

These approaches may also be combined, for example, by using a heat application means, such as a heated roller or the like, or a heat radiation means for directly heating the first protective film, and also indirectly heating the first protective film through the substrate.

If applying the external stimulus to the first protective film comprises or consists of heating the first protective film, it is preferable that the first protective film is pliable, elastic, flexible, stretchable, soft and/or compressible when in its heated state. In this way, it can be particularly reliably ensured that the first protective film conforms to the substrate surface on the one side of the substrate, for example, absorbing the substrate topography. This is especially advantageous if protrusions or projections and/or recesses, such as trenches, grooves, cuts or the like, are present on the front side of the substrate.

Preferably, the first protective film, at least to some degree, hardens or stiffens upon cooling down, so as to become more rigid and/or robust in the cooled down state. In this way, particularly reliable protection of the substrate during subsequent processing, such as applying the laser beam to the substrate, can be ensured.

At least one division line may be formed on the one side of the substrate. A plurality of division lines may be formed on the one side of the substrate. The one or more division lines partition the devices formed in the device area.

The width of the at least one division line may be in the range of 30 μm to 200 μm, preferably 30 μm to 150 μm and more preferably 30 μm to 100 μm.

The laser beam may be applied to the substrate in a plurality of positions along the at least one division line so as to form a plurality of modified regions in the substrate along the at least one division line. By forming the modified regions in this manner, the strength of the substrate along the at least one division line is reduced, thus greatly facilitating division of the substrate along the at least one division line.

The method of the present invention may further comprise attaching the first protective film to the second protective film so as to enclose or encase the substrate between the first protective film and the second protective film. The first protective film may be attached to the second protective film during and/or after attaching the first protective film to the substrate and/or during and/or after attaching the second protective film to the substrate. The substrate may be sealed between the first protective film and the second protective film. The first protective film may be attached to the second protective film at a peripheral portion of the first protective film and/or at a peripheral portion of the second protective film.

By attaching the first and second protective films to each other so as to enclose the substrate therebetween, the substrate can be particularly reliably protected from damage and contamination, e.g., by debris or the like. Moreover, the risk of any warpage of the substrate during processing can be further reduced or even entirely eliminated.

The first protective film may be attached to the substrate during and/or after attaching the second protective film to the substrate. The second protective film may be attached to the substrate during and/or after attaching the first protective film to the substrate.

The first protective film may be attached to the one side of the substrate so that, in the entire region where the front surface of the first protective film is in contact with the one side of the substrate, the front surface of the first protective film is in direct contact with the one side of the substrate. Thus, no material, in particular, no adhesive, is present between the front surface of the first protective film and the one side of the substrate.

In this way, the risk of a possible contamination of or damage to the substrate, e.g., due to an adhesive force of an adhesive layer or adhesive residues on the substrate, can be reliably eliminated.

Alternatively, the first protective film may be provided with an adhesive layer, wherein the adhesive layer is provided only in a peripheral area of the front surface of the first protective film, the peripheral area surrounding the central area of the front surface of the first protective film, and the first protective film is attached to the one side of the substrate so that the adhesive layer comes into contact only with a peripheral portion of the one side of the substrate, e.g., the peripheral marginal area of the substrate.

In this way, the attachment of the first protective film to the substrate can be further improved. Since the adhesive layer is provided only in the peripheral area of the front surface of the first protective film, the area in which first protective film and substrate are attached to each other by the adhesive layer is significantly reduced as compared to a case where an adhesive layer is provided on the entire front surface of the first protective film. Thus, the first protective film can be detached from the substrate more easily and the risk of damage to the substrate, in particular, to the devices formed in the device area, is considerably reduced.

The adhesive of the adhesive layer may be curable by an external stimulus, such as heat, UV radiation, an electric field and/or a chemical agent. In this way, the first protective film can be particularly easily removed from the substrate after processing. The external stimulus may be applied to the adhesive so as to lower the adhesive force thereof, thus allowing for an easy removal of the first protective film.

For example, the adhesive layer may have a substantially annular shape, an open rectangular shape or an open square shape, i.e., a rectangular or square shape, respectively, with an opening in the centre of the adhesive layer.

The second protective film may be attached to the side of the substrate being opposite to the one side so that, in the entire region where the second protective film, in particular, a front surface thereof, is in contact with the side of the substrate being opposite to the one side, the second protective film is attached to the substrate. In this way, the substrate can be particularly reliably and securely held by the second protective film, thus allowing for the risk of any warpage of the substrate during processing to be minimised. The suppression of such substrate warpage can be enhanced even further by attaching the second protective film to an annular frame and, e.g., clamping down the annular frame, so that pressure is applied to the back side of the substrate by the second protective film, as will be detailed below.

By attaching the second protective film to the side of the substrate being opposite to the one side in this manner, it can also be particularly reliably avoided that chips or dies obtained from the substrate may unintentionally drop off from the first protective film, e.g., before and/or during and/or after dividing the substrate into the chips or dies. For example, some of these chips or dies may already be separated from the remainder of the substrate when forming modified regions in the substrate, i.e., before the actual substrate dividing process. Such chips or dies can be especially reliably held by the second protective film.

The second protective film may be attached to the side of the substrate being opposite to the one side in the above-identified manner, e.g., by providing an adhesive layer, for example, in the entire region where the second protective film, in particular, the front surface thereof, comes into contact with the side of the substrate being opposite to the one side, and/or by applying an external stimulus to the second protective film during and/or after applying the second protective film to the side of the substrate being opposite to the one side. This will be explained in further detail in the following.

The second protective film may be provided with an adhesive layer, wherein the adhesive layer is provided in the entire region where the second protective film, in particular, the front surface thereof, comes into contact with the side of the substrate being opposite to the one side. In this way, the second protective film can be attached to the side of the substrate being opposite to the one side in a particularly reliable manner by means of this continuous adhesive layer. Further, there is substantially no risk that the devices in the device area on the one side of the substrate may be damaged or contaminated by the adhesive layer of the second protective film which is attached to the opposite side of the substrate. The adhesive of the adhesive layer may have the same properties as the adhesive of the adhesive layer of the first protective film. The adhesive of the continuous adhesive layer of the second protective film, if present, is made of a material which is transparent to the laser beam to be applied to the substrate.

Alternatively, the second protective film may be attached to the side of the substrate being opposite to the one side so that at least a central area of the front surface of the second protective film is in direct contact with the side of the substrate being opposite to the one side. Thus, no material, in particular, no adhesive, is present between at least the central area of the front surface of the second protective film and the side of the substrate being opposite to the one side.

Therefore, the risk of a possible contamination of or damage to the substrate, e.g., due to an adhesive force of an adhesive layer or adhesive residues on the substrate, can be further reduced or even entirely eliminated. Moreover, attaching the second protective film to the back side of the substrate so that at least the central area of the front surface of the second protective film is in direct contact with this back side allows for the laser beam to be applied to the substrate for forming the plurality of modified regions in the substrate in a particularly efficient and accurate manner.

The second protective film may be attached to the side of the substrate being opposite to the one side so that, in the entire region where the front surface of the second protective film is in contact with the side of the substrate being opposite to the one side, the front surface of the second protective film is in direct contact with the side of the substrate being opposite to the one side. Thus, no material, in particular, no adhesive, is present between the front surface of the second protective film and the side of the substrate being opposite to the one side.

In this way, the risk of a possible contamination of or damage to the substrate, e.g., due to an adhesive force of an adhesive layer or adhesive residues on the substrate, can be reliably eliminated. Moreover, the efficiency and accuracy with which the laser beam can be applied to the substrate for forming the plurality of modified regions in the substrate can be further enhanced.

Alternatively, the second protective film may be provided with an adhesive layer, wherein the adhesive layer is provided only in a peripheral area of the front surface of the second protective film, the peripheral area surrounding the central area of the front surface of the second protective film, and the second protective film is applied to the side of the substrate being opposite to the one side so that the adhesive layer comes into contact only with a peripheral portion of the side of the substrate being opposite to the one side. The peripheral portion of the side of the substrate being opposite to the one side may correspond to the peripheral marginal area formed on the one side of the substrate. The adhesive of the adhesive layer may have the same properties as the adhesive of the adhesive layer of the first protective film.

In this way, the attachment of the second protective film to the substrate can be further improved. Since the adhesive layer is provided only in the peripheral area of the front surface of the second protective film, the area in which second protective film and substrate are attached to each other by the adhesive layer is significantly reduced as compared to the case where the adhesive layer is provided on the entire front surface of the second protective film. Thus, the second protective film can be detached from the substrate more easily and the risk of damage to the substrate, e.g., to protrusions or projections formed on the back side thereof, if present, is considerably reduced.

Attaching the second protective film to the side of the substrate being opposite to the one side may comprise applying the second protective film to the side of the substrate being opposite to the one side, so that at least the central area of the front surface of the second protective film is in direct contact with the side of the substrate being opposite to the one side. Thus, no material, in particular, no adhesive, is present between at least the central area of the front surface of the second protective film and the side of the substrate being opposite to the one side. Further, attaching the second protective film to the side of the substrate being opposite to the one side may comprise applying an external stimulus to the second protective film during and/or after applying the second protective film to the side of the substrate being opposite to the one side, so that the second protective film is attached to the side of the substrate being opposite to the one side. An attachment force between second protective film and substrate, holding the second protective film in its position on the substrate, is thus generated through the application of the external stimulus. Hence, no additional adhesive material is necessary for attaching the second protective film to the side of the substrate being opposite to the one side.

In particular, by applying the external stimulus to the second protective film, a form fit, such as a positive fit, and/or a material bond, such as an adhesive bond, may be formed between the second protective film and the substrate. The external stimulus and the way of applying it to the second protective film may be the same as described above for the first protective film.

The adhesive of the adhesive layer of the second protective film, e.g., the continuous adhesive layer or the adhesive layer which is provided only in the peripheral area of the front surface of the second protective film, may be curable by an external stimulus, such as heat, UV radiation, an electric field and/or a chemical agent. In this way, the second protective film can be particularly easily removed from the substrate after processing. The external stimulus may be applied to the adhesive so as to lower the adhesive force thereof, thus allowing for an easy removal of the second protective film. In particular, chips or dies obtained by dividing the substrate can be picked up from the second protective film in an especially easy manner.

The substrate back side surface may be a substantially flat, even surface. Alternatively, protrusions or projections protruding from a plane substrate surface along the thickness direction of the substrate and/or recesses, such as trenches, grooves, cuts or the like, extending inwards from the plane substrate surface may be present on the back side of the substrate. The second protective film may be attached to the side of the substrate being opposite to the one side so as to at least partly follow the contours or the topography of the side of the substrate being opposite to the one side, e.g., the contours of protrusions or projections and/or recesses present on this substrate side.

The second protective film may be heat resistant up to a temperature of 180° C. or more, preferably up to a temperature of 220° C. or more, more preferably up to a temperature of 250° C. or more, and even more preferably up to a temperature of 300° C. or more.

If applying the external stimulus to the second protective film comprises or consists of heating the second protective film, it is preferable that the second protective film is pliable, elastic, flexible, stretchable, soft and/or compressible when in its heated state. In this way, it can be particularly reliably ensured that the second protective film conforms to the substrate surface on the side of the substrate being opposite to the one side, for example, absorbing the substrate topography. This is especially advantageous if protrusions or projections and/or recesses, such as trenches, grooves, cuts or the like, are present on the back side of the substrate.

A cushioning layer may be attached to a back surface of the first protective film opposite to the front surface thereof. The cushioning layer may be attached to the first protective film at a front surface of the cushioning layer.

This approach is particularly advantageous if protrusions or projections and/or recesses, such as trenches, grooves, cuts or the like, are present on the one side of the substrate. In this case, the protrusions or projections and/or the recesses define a surface structure or topography of the substrate front side, rendering this side uneven.

If the cushioning layer is attached to the back surface of the first protective film, the substrate surface structure or topography, such as protrusions or projections, can be embedded in the cushioning layer. Hence, any negative influence of the surface unevenness arising from the presence of the protrusions or projections and/or the recesses on subsequent substrate processing, in particular, applying the laser beam to the substrate and/or reducing the substrate thickness, e.g., by grinding, can be eliminated. The cushioning layer can significantly contribute to achieving a particularly uniform and homogeneous distribution of pressure during processing. By embedding, for example, protrusions or projections in the cushioning layer, the protrusions or projections are reliably protected from any damage during substrate processing.

The material of the cushioning layer is not particularly limited. In particular, the cushioning layer may be formed of any type of material which allows for the substrate surface structure or topography, such as protrusions or projections, to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the methods of the invention are ResiFlat by the DISCO Corporation and TEMPLOC by DENKA.

The method may further comprise applying the external stimulus to the cushioning layer so as to cure the cushioning layer, e.g., before applying the laser beam to the substrate and/or reducing the substrate thickness, e.g., by grinding. In this way, the protection of the substrate during the application of the laser beam is improved and the efficiency and accuracy with which the plurality of modified regions can be formed in the substrate is further enhanced.

The cushioning layer may be heat resistant up to a temperature of 180° C. or more, preferably up to a temperature of 220° C. or more, more preferably up to a temperature of 250° C. or more, and even more preferably up to a temperature of 300° C. or more.

The cushioning layer may have a thickness in the range of 10 to 300 μm, preferably 20 to 250 μm and more preferably 50 to 200 μm.

The cushioning layer may be attached to the back surface of the first protective film before applying or attaching the first protective film to the one side of the substrate.

In this case, the first protective film and the cushioning layer may be laminated first, forming a protective sheeting comprising the cushioning layer and the first protective film attached to the cushioning layer. The protective sheeting formed in this manner may be subsequently applied to the one side of the substrate, e.g., so that the substrate surface structure or topography, such as protrusions or projections, is covered by the first protective film and embedded in the first protective film and the cushioning layer. The protective sheeting may be applied so that a back surface of the cushioning layer, which is opposite to the front surface of the cushioning layer, is substantially parallel to the side of the substrate being opposite to the one side. The front surface of the first protective film is applied to the one side of the substrate when the protective sheeting is applied to the one side of the substrate.

In this way, the substrate processing method can be carried out in a particularly simple and efficient manner. For example, the protective sheeting can be prepared in advance, stored for later use and used for substrate processing when required. The protective sheeting may thus be manufactured in large quantities, rendering the production thereof particularly efficient in terms of both time and cost.

The cushioning layer may be attached to the back surface of the first protective film after applying or attaching the first protective film to the one side of the substrate.

In this case, the first protective film is applied to the one side of the substrate first, and the one side of the substrate, having the first protective film applied thereto, is subsequently attached to the front surface of the cushioning layer, e.g., so that the substrate surface structure or topography, such as protrusions or projections, is embedded in the first protective film and the cushioning layer, and the back surface of the cushioning layer is substantially parallel to the side of the substrate being opposite to the one side. This approach allows for the first protective film to be attached to the one side of the substrate with a particularly high degree of accuracy, in particular, in relation to the substrate surface structure or topography.

The cushioning layer may be attached to the back surface of the first protective film before and/or during and/or after attaching the first protective film to the one side of the substrate.

A base sheet may be attached to the back surface of the cushioning layer, i.e., to the surface of the cushioning layer which is opposite to the front surface thereof. The front surface of the cushioning layer is attached to the first protective film.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 µm, preferably 40 to 1200 µm and more preferably 50 to 1000 µm.

The cushioning layer and the base sheet may be attached to the back surface of the first protective film before or after applying the first protective film to the one side of the substrate. In particular, the first protective film, the cushioning layer and the base sheet may be laminated first, forming a protective sheeting comprising the base sheet, the cushioning layer and the first protective film attached to the cushioning layer. The protective sheeting formed in this manner may be subsequently applied to the substrate front side.

A front surface of the base sheet may be in contact with the back surface of the cushioning layer, and a back surface of the base sheet opposite to the front surface thereof may be substantially parallel to the side of the substrate being opposite to the one side. Thus, when processing the substrate, a suitable counter pressure can be applied to the back surface of the base sheet, e.g., by placing this back surface on a support or carrier, such as a chuck table.

In this case, since the plane back surface of the base sheet is substantially parallel to the back side of the substrate, pressure applied to the substrate during processing is more evenly and homogeneously distributed over the substrate, thus minimising any risk of breakage of the substrate. Further, the substantially parallel alignment of the flat, even back surface of the base sheet and the back side of the substrate allows for the plurality of modified regions to be formed in the substrate by the application of the laser beam with a particularly high degree of precision, thus achieving the production of high quality dies or chips with well-defined shapes and sizes.

The method may further comprise grinding and/or polishing, e.g., dry polishing, and/or etching, e.g., plasma etching, the side of the substrate being opposite to the one side, in particular, before applying or attaching the second protective film to the substrate. The side of the substrate being opposite to the one side may be ground for adjusting the substrate thickness.

The second protective film may be expandable.

The second protective film may be expanded when being applied to the side of the substrate being opposite to the one side.

In particular, the second protective film may be expanded when being applied to the side of the substrate being opposite to the one side so as to at least partly follow the contours or the topography of the side of the substrate being opposite to the one side, e.g., the contours of protrusions or projections and/or recesses present on this substrate side.

For example, the second protective film may be expandable to twice its original size or more, preferably three times its original size or more and more preferably four times its original size or more. In this way, in particular, for the case of an expansion to three or four times its original size or more, it can be especially reliably ensured that the second protective film follows the contours or the topography of the side of the substrate being opposite to the one side.

If the second protective film is expandable it may be used for separating the devices from each other. In particular, the method may further comprise, after applying the laser beam to the substrate from the side of the substrate being opposite to the one side, radially expanding the second protective film so as to separate the devices from each other. The second protective film may be radially expanded after removing the first protective film from the substrate front side. The substrate may be divided, e.g., broken, along the area or areas where the plurality of modified regions has been formed in the substrate, e.g., along the at least one division line, by radially expanding the second protective film, thereby obtaining individual chips or dies. By radially expanding the second protective film, an external force is applied to the substrate, thus dividing the substrate where its strength has been reduced due to the presence of the modified regions. After dividing the substrate in this manner, the resulting chips or dies can be picked up directly from the second protective film, e.g., by using a pick-up device.

Alternatively, the first protective film, if expandable, may be used for separating the devices from each other. In this case, the method may further comprise, after applying the laser beam to the substrate, radially expanding the first protective film so as to separate the devices from each other. The first protective film may be radially expanded after removing the second protective film from the substrate back side. Thus, the substrate may be divided, e.g., broken, along the area or areas where the plurality of modified regions has been formed in the substrate, e.g., along the at least one division line, by radially expanding the first protective film, thereby obtaining the individual chips or dies. This latter approach can be adopted in a particularly advantageous manner, for example, if the first protective film has been attached to the one side of the substrate by applying heat and/or pressure to the first protective film, as has been detailed above. After dividing the substrate in this manner, the resulting chips or dies can be picked up directly from the first protective film, e.g., by using a pick-up device.

As an alternative to radially expanding the first protective film or the second protective film, a separate expansion tape may be attached to the substrate back side, e.g., after removing the second protective film. Subsequently, the devices may be separated from each other by radially expanding the expansion tape.

If the first protective film or the second protective film is used for separating the devices from each other, there is no need to remount the substrate to a different film or tape, such as a separate expansion tape, for dividing the substrate. Hence, the substrate can be divided in a particularly efficient manner. Moreover, the risk of any damage to the substrate and/or the resulting chips or dies, e.g., due to chips or dies unintentionally dropping off from their support, can be further reduced.

The method of the present invention may further comprise attaching the first protective film and/or the second protective film to an annular frame. For example, the first protective film may be attached to a first annular frame and the second protective film may be attached to a second annular frame, i.e., to another annular frame. Alternatively, the first and second protective films may be attached to the same annular frame, i.e., to a single annular frame.

In particular, an outer peripheral portion of the first protective film may be attached to an annular frame. The outer peripheral portion of the first protective film may be attached to the annular frame so that the first protective film closes a central opening of the annular frame, i.e., the area inside the inner diameter of the annular frame. In this way, the substrate, which is attached to the first protective film, in particular, to a central portion thereof, is held by the annular frame through the first protective film. Thus, a substrate unit, comprising the substrate, the first protective film and the annular frame, is formed, facilitating processing, handling and/or transport of the substrate.

The step of attaching the outer peripheral portion of the first protective film to the annular frame may be performed before or during or after applying or attaching the first protective film to the substrate.

The step of attaching the outer peripheral portion of the first protective film to the annular frame may be performed before or after applying the laser beam to the substrate.

An outer peripheral portion of the second protective film may be attached to an annular frame. The outer peripheral portion of the second protective film may be attached to the annular frame so that the second protective film closes a central opening of the annular frame, i.e., the area inside the inner diameter of the annular frame. In this way, the substrate, which is attached to the second protective film, in particular, to a central portion thereof, is held by the annular frame through the second protective film. Thus, a substrate unit, comprising the substrate, the second protective film and the annular frame, is formed, facilitating processing, handling and/or transport of the substrate.

The step of attaching the outer peripheral portion of the second protective film to the annular frame may be performed before or during or after applying or attaching the second protective film to the substrate.

The step of attaching the outer peripheral portion of the second protective film to the annular frame may be performed before or after applying the laser beam to the substrate.

The annular frame attached to the first and/or second protective film may further facilitate the process of dividing the substrate. For example, if the second protective film is expandable and attached to an annular frame, the second protective film can be expanded, e.g., by moving the annular frame and an expansion drum relative to each other in a conventional manner, thereby separating the devices from each other. If the first protective film is expandable and attached to an annular frame, the first protective film can be expanded, e.g., by moving the annular frame and an expansion drum relative to each other in a conventional manner, thereby separating the devices from each other.

The method of the present invention may further comprise removing the first protective film from the one side of the substrate. The first protective film may be removed from the one side of the substrate after applying the laser beam to the substrate. The first protective film may be removed from the one side of the substrate before radially expanding the second protective film so as to separate the devices from each other.

The method may further comprise removing the first protective film, the cushioning layer, if present, and the base sheet, if present, from the one side of the substrate. The first protective film, the cushioning layer and the base sheet may be removed from the one side of the substrate after applying the laser beam to the substrate. The first protective film, the cushioning layer and the base sheet may be removed from the one side of the substrate before radially expanding the second protective film so as to separate the devices from each other.

The base sheet, the cushioning layer and the first protective film may be removed from the substrate individually, i.e., one after the other. For example, the base sheet may be removed first, followed by the removal of the cushioning layer and, subsequently, by the removal of the first protective film. Alternatively, the base sheet, the cushioning layer and the first protective film may be removed from the substrate together. Also, the base sheet may be removed together with the cushioning layer, or the cushioning layer may be removed together with the first protective film.

The method of the present invention may further comprise removing the second protective film from the side of the substrate being opposite to the one side. The second protective film may be removed from the side of the substrate being opposite to the one side after applying the laser beam to the substrate. The second protective film may be removed from the side of the substrate being opposite to the one side before radially expanding the first protective film so as to separate the devices from each other.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a substrate.

In the present embodiments, the method of the invention is performed on a wafer W as the substrate to be processed. The wafer W may be a semiconductor wafer, such as, for example, a Si wafer. In particular, the wafer W may be a single crystal Si wafer. However, different types of substrate and, in particular, different substrate materials may be used, as has been detailed above.

For example, the wafer W can have a thickness before grinding in the μm range, preferably in the range of 625 to 925 μm. In the present embodiment, the wafer W exhibits a substantially circular shape in a top view thereon. However, the shape of the wafer W is not particularly limited. In other embodiments, the wafer W may have, for example, an oval shape, an elliptical shape or a polygonal shape, such as a rectangular shape or a square shape.

Figure 1:
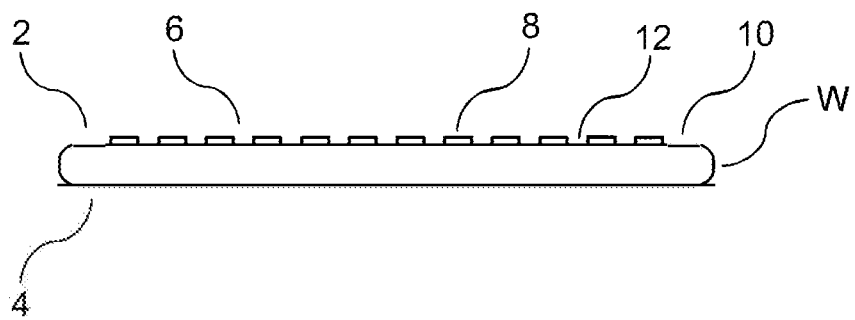
FIG. 1 is a cross-sectional view showing a wafer as the substrate to be processed by methods of the present invention.

The wafer W has one side, i.e., a front side 2, and a side being opposite to the one side, i.e., a back side 4 (see FIG. 1). A device area 6 with a plurality of devices 8 is formed on the front side 2 of the wafer W. The devices 8 may be, for example, semiconductor devices, power devices, optical devices, medical devices, electrical components, MEMS devices or combinations thereof. The devices 8 may comprise or be, for example, transistors, such as MOSFETs or insulated-gate bipolar transistors (IGBTs), or diodes, e.g., Schottky barrier diodes.

In the present embodiment, the device area 6 has a substantially circular shape and is arranged concentrically with the outer circumference of the wafer W. The device area 6 is surrounded by an annular peripheral marginal area 10 (see FIG. 1). In this peripheral marginal area 10, no devices are formed. The peripheral marginal area 10 is arranged concentrically with the device area 6 and the outer circumference of the wafer W. The radial extension of the peripheral marginal area 10 can be in the mm range and preferably ranges from 1 mm to 3 mm.

A plurality of division lines 12 is formed on the front side 2 of the wafer W. The division lines 12 are arranged in a grid pattern so as to partition the front side 2 into a plurality of rectangular regions. In each of these regions, a device 8 is provided. The division lines 12 may have widths in the range of 30 μm to 200 μm, preferably 30 μm to 150 μm and more preferably 30 μm to 100 μm.

In the following, a method of processing the wafer W according to a first embodiment of the present invention will be described with reference to FIGS. 1 to 6.

Figure 2:
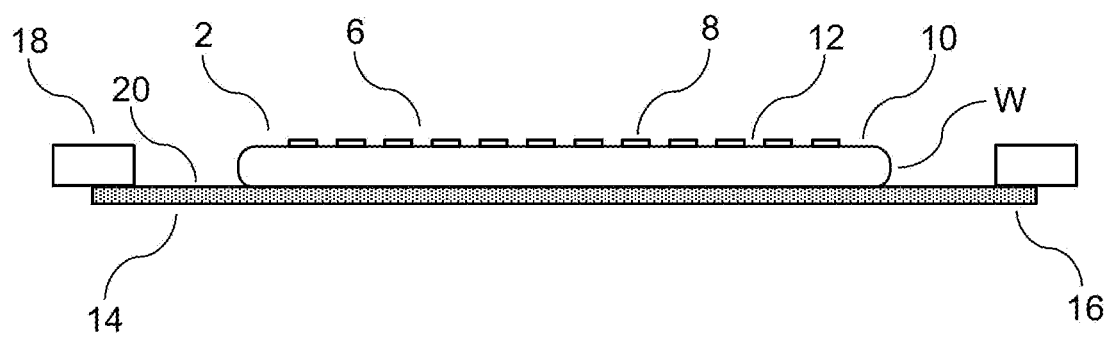
FIG. 2 is a cross-sectional view showing the outcome of a step of attaching a second protective film to the wafer according to a first embodiment of the method of the present invention.

In the method of the present embodiment, a second protective film 14 is attached to the back side 4 of the wafer W first. The outcome of this attachment step is shown in FIG. 2. For example, the second protective film 14 may be made of a polyolefin, such as polyethylene (PE), polypropylene (PP) or polybutylene (PB). The second protective film 14 may have a thickness in the range of 5 to 500 μm, preferably 5 to 200 μm, more preferably 8 to 100 μm, even more preferably 10 to 80 μm and yet even more preferably 12 to 50 μm.

The second protective film 14 has a substantially circular shape and an outer diameter which is larger than the outer diameter of the wafer W. An outer peripheral portion 16 of the second protective film 14 is attached to an annular frame 18 (see FIG. 2). The second protective film 14 may be attached to the annular frame 18 before or during or after attaching the second protective film 14 to the wafer W. The second protective film 14 may be attached to the annular frame 18, for example, by means of an adhesive (not shown). The wafer W and the annular frame 18 are attached to the same surface of the second protective film 14, namely to a front surface 20 thereof.

The second protective film 14 may be attached to the back side 4 of the wafer W by employing one of the approaches described in detail above, e.g., by using a continuous adhesive layer (not shown), by using an adhesive layer (not shown) which is provided only in a peripheral area of the front surface 20 of the second protective film 14 or without using an adhesive. In these latter two cases, attaching the second protective film 14 to the back side 4 of the wafer W may comprise applying an external stimulus, such as, e.g., heat and/or pressure and/or a vacuum, to the second protective film 14 during and/or after applying the second protective film 14 to the back side 4, as has been detailed above.

Figure 3:
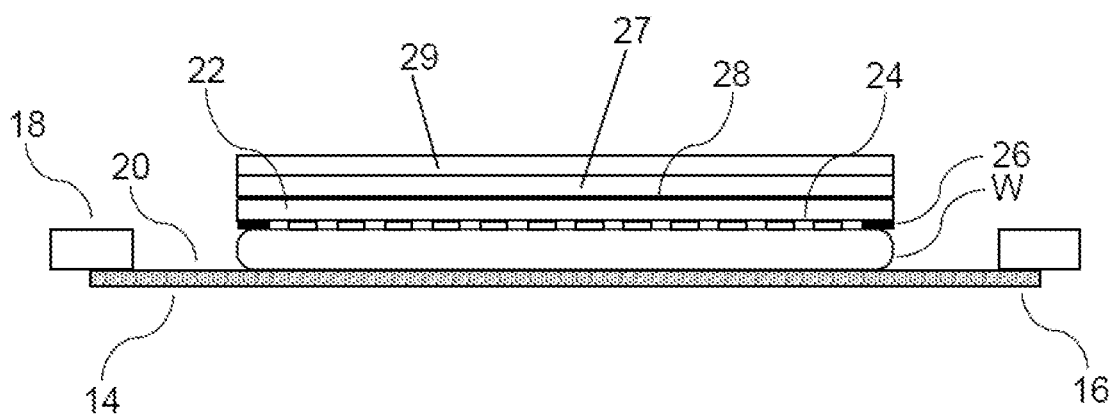
FIG. 3 is a cross-sectional view showing the outcome of a step of attaching a first protective film to the wafer according to the first embodiment of the method of the present invention.

After attaching the second protective film 14 to the back side 4 of the wafer W, a first protective film 22 is attached to the wafer W. The outcome of this attachment step is shown in FIG. 3. The first protective film 22 is attached to the front side 2 of the wafer W so that a central area of a front surface 24 of the first protective film 22 is in direct contact with the front side 2. Thus, no material, in particular, no adhesive, is present between the central area of the front surface 24 of the first protective film 22 and the front side 2.

For example, the first protective film 22 may be made of a polyolefin, such as polyethylene (PE), polypropylene (PP) or polybutylene (PB). The first protective film 22 may have a thickness in the range of 5 to 500 μm, preferably 5 to 200 μm, more preferably 8 to 100 μm, even more preferably 10 to 80 μm and yet even more preferably 12 to 50 μm.

The first protective film 22 has a substantially circular shape and an outer diameter which is substantially the same as the outer diameter of the wafer W. The first protective film 22 covers the devices 8 formed in the device area 6.

The first protective film 22 is provided with an adhesive layer 26 (see FIG. 3). The adhesive layer 26 is provided only in a peripheral area of the front surface 24 of the first protective film 22, the peripheral area surrounding the central area of the front surface 24. The adhesive layer 26 has a substantially annular shape. The first protective film 22 is attached to the front side 2 of the wafer W so that the adhesive layer 26 comes into contact only with a peripheral portion of the front side 2 of the wafer W, namely with the peripheral marginal area 10 (see FIG. 1). The adhesive of the adhesive layer 26 may be curable by an external stimulus, such as heat, UV radiation, an electric field and/or a chemical agent.

Further, an external stimulus may be applied to the first protective film 22 during and/or after applying the first protective film 22 to the front side 2 of the wafer W, so that the first protective film 22 is attached to the front side 2 also in the central area of the front surface 24 where no adhesive is present. By the application of the external stimulus, an attachment force between the first protective film 22 and the wafer W is generated in the central area of the front surface 24. The type of external stimulus and the way of applying it to the first protective film 22 may be as detailed above. For example, the external stimulus may comprise or be heat and/or pressure and/or a vacuum.

In other embodiments, no adhesive layer may be provided on the front surface 24 of the first protective film 22, so that the entire front surface 24 of the first protective film 22 is in direct contact with the front side 2 of the wafer W. In this case, the first protective film 22 can be attached to the front side 2 by applying an external stimulus to the first protective film 22, as has been detailed above.

In other embodiments, a cushioning layer 27 may be attached to a back surface 28 of the first protective film 22 opposite to the front surface 24 thereof, as has been described in detail above. A base sheet 29 may be attached to a back surface of the cushioning layer, as has also been detailed above.

Figure 4:
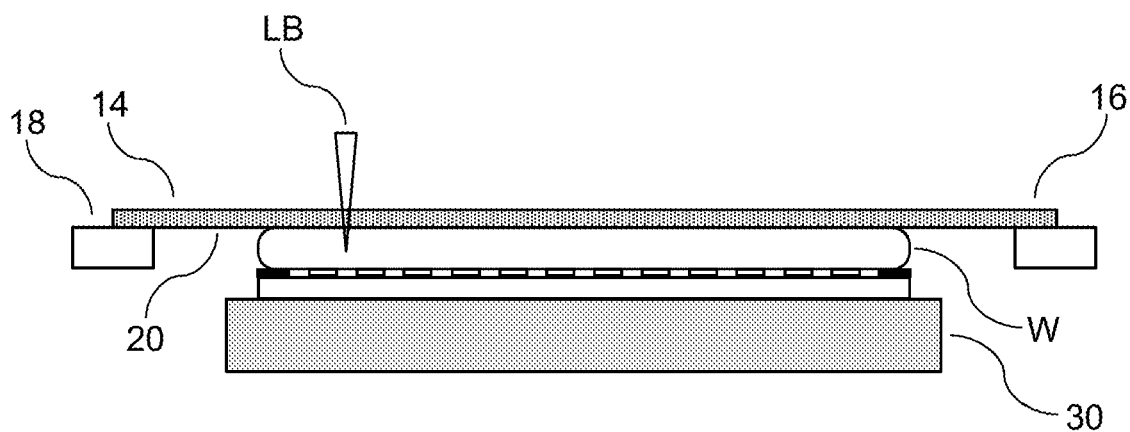
FIG. 4 is a cross-sectional view illustrating a step of applying a laser beam to the wafer according to the first embodiment of the method of the present invention.

After attaching the first and second protective films 22, 14 to the wafer W, the wafer W is placed on a chuck table 30 so that the back surface 28 of the first protective film 22 is in contact with an upper surface of the chuck table 30. Hence, the back side 4 of the wafer W, having the second protective film 14 attached thereto, is oriented upwards. Subsequently, a laser beam LB is applied to the wafer W from the back side 4 thereof, as is illustrated in FIG. 4. The second protective film 14 is made of a material which is transparent to the laser beam LB. Therefore, the laser beam LB is transmitted through the second protective film 14.

In the present embodiment, the laser beam LB is a pulsed laser beam, e.g., having a pulse width in the range of 1 fs to 2000 ns. The wafer W is made of a material, e.g., Si, which is transparent to the laser beam LB. The laser beam LB is applied to the wafer W in a plurality of positions along the division lines 12 so as to form a plurality of modified regions (not shown) in the wafer W along the division lines 12. The laser beam LB is applied to the wafer W in this plurality of positions in a condition where a focal point of the laser beam LB is located within the bulk of the wafer W. The modified regions may comprise or be amorphous regions and/or regions in which cracks are formed. Preferably, the modified regions comprise or are amorphous regions.

During the application of the laser beam LB to the wafer W, the wafer W is reliably held by the second protective film 14 attached thereto (see FIG. 4). Therefore, any warpage of the wafer W during this processing can be suppressed or even entirely prevented, allowing for the accuracy with which the modified regions can be formed within the wafer W to be significantly enhanced. In particular, the modified regions can be consistently formed at the same depth inside the wafer W, i.e., at the same position along the thickness direction of the wafer W.

Figure 5:
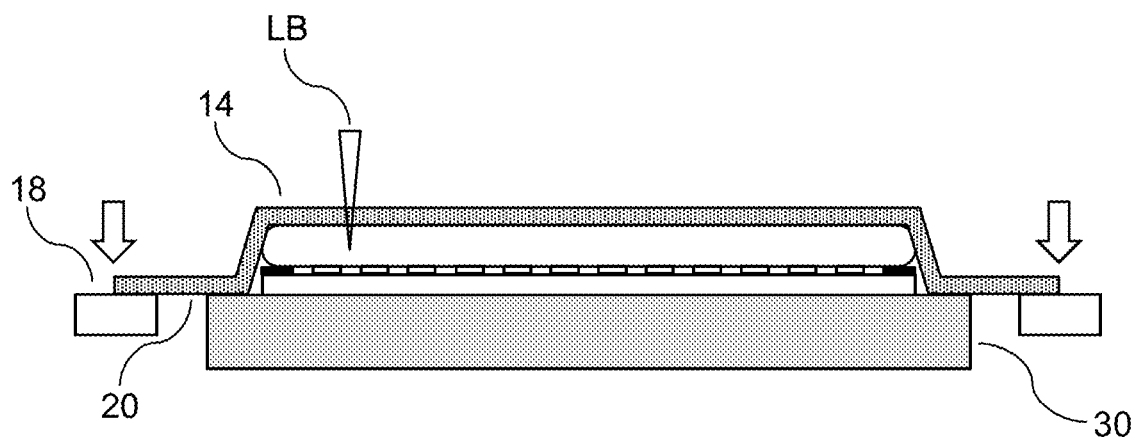
FIG. 5 is a cross-sectional view illustrating a step of applying a laser beam to the wafer according to a modification of the first embodiment of the method of the present invention.

FIG. 5 is a cross-sectional view illustrating a step of applying the laser beam LB to the wafer W according to a modification of the first embodiment of the method of the present invention. In this modified method, the annular frame 18 is displaced relative to the wafer W and the chuck table 30 in a vertically downward direction, as is indicated by two arrows in FIG. 5. For example, for this purpose, the annular frame 18 may be clamped down. Hence, the outer peripheral portion 16 of the second protective film 14 is displaced accordingly, as shown in FIG. 5, and pressure is applied to the back side 4 of the wafer W by the second protective film 14. In this way, the risk of any warpage of the wafer W during the application of the laser beam LB thereto can be minimised.

The annular frame 18 can be displaced relative to the wafer W and the chuck table 30 in the vertically downward direction to different extents, e.g., depending on the material and/or thickness of the wafer W and on processing parameters, such as the number or areal density of the modified regions to be formed in the wafer W. In this way, the pressure applied to the back side 4 of the wafer W by the second protective film 14 can be suitably controlled. The annular frame 18 may be displaced relative to the wafer W and the chuck table 30 to such an extent that the front surface 20 of the second protective film 14, optionally having an adhesive layer provided thereon, comes into contact with the upper surface of the chuck table 30, as is shown in FIG. 5. This approach offers the additional advantage that the wafer W can be fully enclosed between the second protective film 14 and the chuck table 30, allowing for the wafer W to be particularly reliably protected from damage and contamination.

After the modified regions have been formed in the wafer W, the first protective film 22 is removed from the front side 2 of the wafer W. If the adhesive of the adhesive layer 26 is curable by an external stimulus, this removal process can be facilitated by applying the external stimulus to the adhesive so as to lower the adhesive force thereof.

Figure 6:
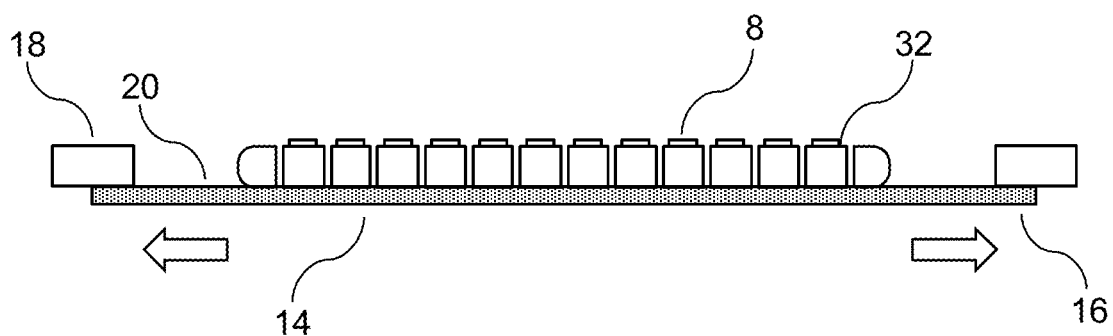
FIG. 6 is a cross-sectional view illustrating a step of radially expanding the second protective film, so as to separate devices of the wafer from each other, according to the first embodiment of the method of the present invention.

After removing the first protective film 22 from the wafer W, the wafer W is divided into individual dies 32 (see FIG. 6). In particular, the second protective film 14, which is an expandable film, is radially expanded, as is indicated by two arrows in FIG. 6, e.g., by moving the annular frame 18 and an expansion drum (not shown) relative to each other in a conventional manner. By radially expanding the second protective film 14, an external force is applied to the wafer W, thus dividing the wafer W along the division lines 12 where the wafer strength has been reduced due to the presence of the modified regions. In this way, the fully separated dies 32 are obtained. After dividing the wafer W in this manner, the resulting dies 32 can be picked up directly from the second protective film 14, e.g., by using a conventional pick-up device (not shown).

In the following, a method of processing the wafer W according to a second embodiment of the present invention will be described with reference to FIGS. 7 to 9.

The method of the second embodiment differs from the method of the first embodiment in the configuration and arrangement of the first protective film 22. In the description of the second embodiment, the elements which are similar or substantially identical to those of the first embodiment are denoted by the same reference signs and a repeated detailed description thereof is omitted.

In the method of the second embodiment, the second protective film 14 is attached to the wafer W in the same manner as in the method of the first embodiment (see FIG. 2). Subsequently, the first protective film 22 is attached to the wafer W. The outcome of this attachment step is shown in FIG. 7. The first protective film 22 is attached to the front side 2 of the wafer W so that the central area of the front surface 24 of the first protective film 22 is in direct contact with the front side 2. The material and the thickness of the first protective film 22 used in the method of the second embodiment may be the same as those of the first protective film 22 used in the method of the first embodiment.

The first protective film 22 has a substantially circular shape and an outer diameter which is larger than the outer diameter of the wafer W. The first protective film 22 covers the devices 8 formed in the device area 6.

Figure 7:
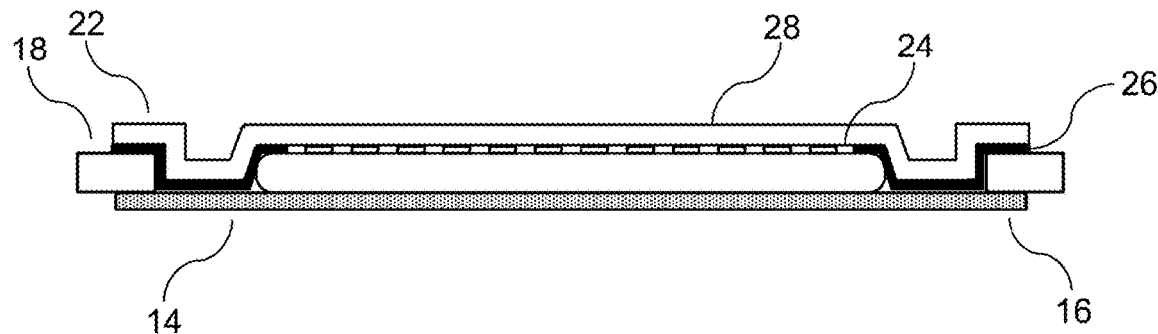
FIG. 7 is a cross-sectional view showing the outcome of a step of attaching a first protective film to the wafer according to a second embodiment of the method of the present invention.

The first protective film 22 is provided with the adhesive layer 26 (see FIG. 7). The adhesive layer 26 is provided only in a peripheral area of the front surface 24 of the first protective film 22, the peripheral area surrounding the central area of the front surface 24. The adhesive layer 26 has a substantially annular shape. The first protective film 22 is attached to the front side 2 of the wafer W so that the adhesive layer 26 comes into contact only with a peripheral portion of the front side 2 of the wafer W, namely with the peripheral marginal area 10 (see FIG. 1). The adhesive of the adhesive layer 26 may be curable by an external stimulus, such as heat, UV radiation, an electric field and/or a chemical agent.

Further, the first protective film 22 is attached to the second protective film 14 by means of the adhesive layer 26 so as to enclose the wafer W between the first protective film 22 and the second protective film 14. The adhesive layer 26 thus forms a seal around the outer circumference of the wafer W. Hence, the wafer W can be particularly reliably protected from damage and contamination.

In other embodiments, no adhesive layer may be provided on the front surface 24 of the first protective film 22, at least in the region where the front surface 24 of the first protective film 22 comes into contact with the second protective film 14. In this case, the first protective film 22 may be attached to the second protective film 14 by means of an adhesive layer (not shown) provided on the front surface 20 of the second protective film 14.

Moreover, by means of the adhesive layer 26, the first protective film 22 is attached to the annular frame 18, i.e., to the same annular frame 18 as the second protective film 14. Hence, a particularly stable and reliable wafer unit, comprising the wafer W, the first protective film 22, the second protective film 14 and the annular frame 18, is formed. Alternatively, the first protective film 22 may be attached to a different annular frame (not shown).

The first protective film 22 may be attached to the second protective film 14 and to the annular frame 18 during or after attaching the first protective film 22 to the wafer W.

An external stimulus may be applied to the first protective film 22 during and/or after applying the first protective film 22 to the front side 2 of the wafer W, so that the first protective film 22 is attached to the front side 2 also in the central area of the front surface 24 where no adhesive is present, in the same manner as detailed above for the method of the first embodiment.

In other embodiments, the first protective film 22 may be attached to the front side 2 of the wafer W so that, in the entire region where the front surface 24 of the first protective film 22 is in contact with the front side 2, the front surface 24 is in direct contact with the front side 2. In this case, the first protective film 22 can be attached to the front side 2 by applying an external stimulus to the first protective film 22, as has been detailed above.

In other embodiments, a cushioning layer (not shown) may be attached to the back surface 28 of the first protective film 22 opposite to the front surface 24 thereof, as has been described in detail above. A base sheet (not shown) may be attached to a back surface of the cushioning layer, as has also been detailed above.

Figure 8:
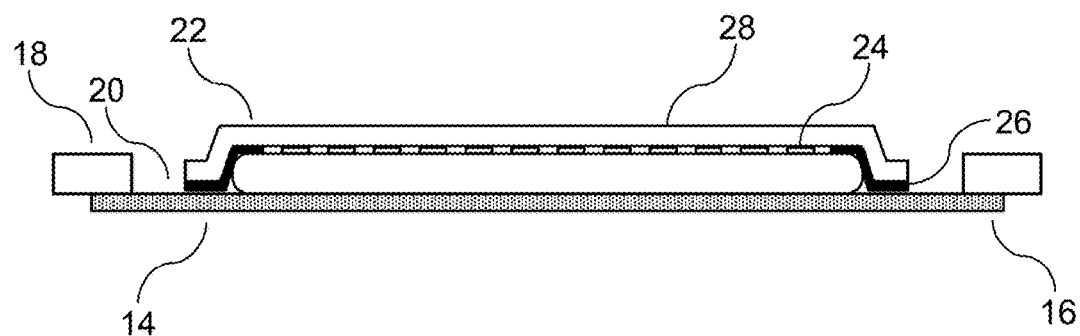
FIG. 8 is a cross-sectional view showing the outcome of a step of attaching a first protective film to the wafer according to a modification of the second embodiment of the method of the present invention.
Figure 9:
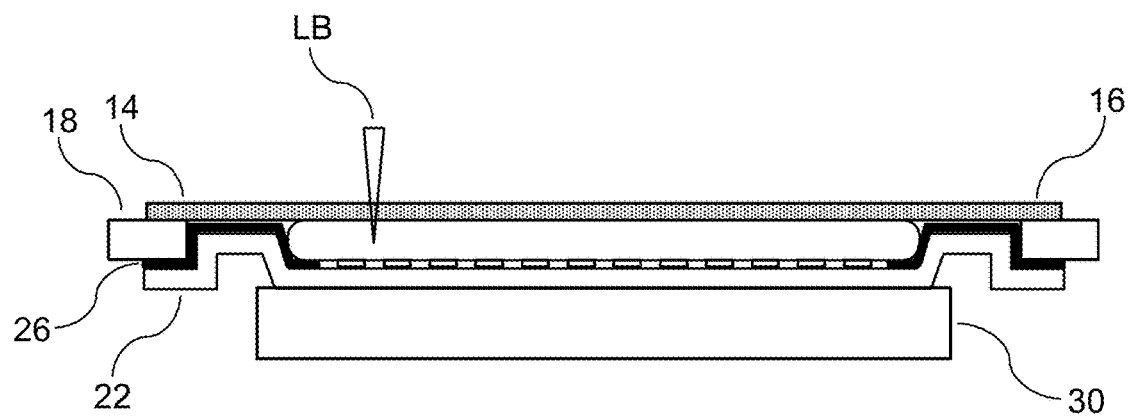
FIG. 9 is a cross-sectional view illustrating a step of applying a laser beam to the wafer according to the second embodiment of the method of the present invention.

FIG. 8 is a cross-sectional view showing the outcome of a step of attaching the first protective film 22 to the wafer W according to a modification of the second embodiment of the method of the present invention. In this modified method, the first protective film 22 has a reduced outer diameter which does not extend to the annular frame 18. However, also in this modified embodiment, the first protective film 22 is attached to the second protective film 14 by means of the adhesive layer 26 so as to enclose the wafer W between the first protective film 22 and the second protective film 14.

After attaching the first and second protective films 22, 14 to the wafer W, the wafer W is placed on the chuck table 30 so that the back surface 28 of the first protective film 22 is in contact with the upper surface of the chuck table 30. Subsequently, the laser beam LB is applied to the wafer W from the back side 4 thereof in the same manner as in the method of the first embodiment, as is illustrated in FIG. 9. The laser beam LB is applied to the wafer W in a plurality of positions along the division lines 12 so as to form a plurality of modified regions (not shown) in the wafer W along the division lines 12.

As in the method of the first embodiment, the laser beam LB may be applied to the wafer W in a state in which the annular frame 18 has been displaced relative to the wafer W and the chuck table 30 in a vertically downward direction, e.g., by clamping down the annular frame 18.

After the modified regions have been formed in the wafer W, the first protective film 22 is removed from the front side 2 of the wafer W. Subsequently, the wafer W is divided into individual dies 32 in the same manner as in the method of the first embodiment, i.e., by radially expanding the second protective film 14 (see FIG. 6). The resulting dies 32 can be picked up directly from the second protective film 14, e.g., by using a conventional pick-up device (not shown).

In the following, a method of processing the wafer W according to a third embodiment of the present invention will be described with reference to FIGS. 10 to 17.

The method of the third embodiment differs from the methods of the first and second embodiments in the order of attaching the first and second protective films 22, 14 to the wafer W. In the description of the third embodiment, the elements which are similar or substantially identical to those of the first and second embodiments are denoted by the same reference signs and a repeated detailed description thereof is omitted.

Figure 10:
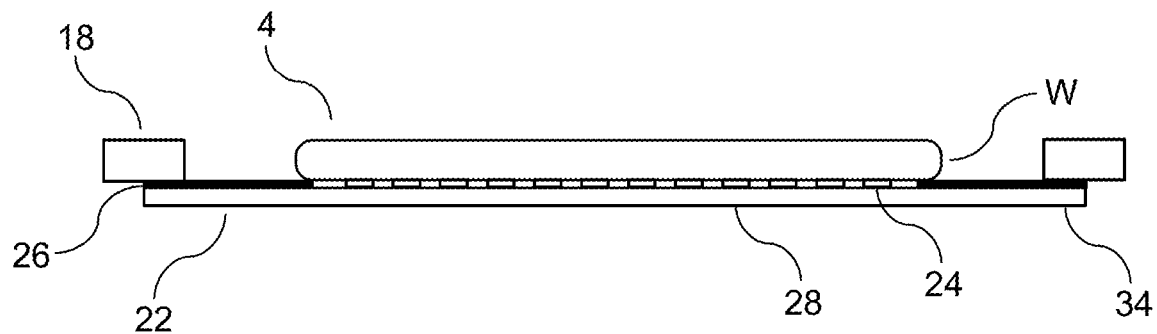
FIG. 10 is a cross-sectional view showing the outcome of a step of attaching a first protective film to the wafer according to a third embodiment of the method of the present invention.

In the method of the third embodiment, the first protective film 22 is attached to the front side 2 of the wafer W first. The outcome of this attachment step is shown in FIG. 10. The material and the thickness of the first protective film 22 used in the method of the third embodiment may be the same as those of the first protective film 22 used in the methods of the first and second embodiments. The first protective film 22 is attached to the front side 2 of the wafer W so that a central area of the front surface 24 of the first protective film 22 is in direct contact with the front side 2. The first protective film 22 covers the devices 8 formed in the device area 6.

The first protective film 22 has a substantially circular shape and an outer diameter which is larger than the outer diameter of the wafer W. An outer peripheral portion 34 of the first protective film 22 is attached to the annular frame 18 (see FIG. 10). The first protective film 22 may be attached to the annular frame 18 before or during or after attaching the first protective film 22 to the wafer W. The first protective film 22 is attached to the annular frame 18 by means of the adhesive layer 26. The wafer W and the annular frame 18 are attached to the same surface of the first protective film 22, namely to the front surface 24 thereof.

The adhesive layer 26 of the first protective film 22 is provided only in a peripheral area of the front surface 24 of the first protective film 22, the peripheral area surrounding the central area of the front surface 24. The adhesive layer 26 has a substantially annular shape. The first protective film 22 is attached to the front side 2 of the wafer W so that the adhesive layer 26 comes into contact only with a peripheral portion of the front side 2 of the wafer W, namely with the peripheral marginal area 10 (see FIG. 1). The adhesive of the adhesive layer 26 may be curable by an external stimulus, such as heat, UV radiation, an electric field and/or a chemical agent.

Further, an external stimulus may be applied to the first protective film 22 during and/or after applying the first protective film 22 to the front side 2 of the wafer W, so that the first protective film 22 is attached to the front side 2 also in the central area of the front surface 24 where no adhesive is present. The type of external stimulus and the way of applying it to the first protective film 22 may be as detailed above. For example, the external stimulus may comprise or be heat and/or pressure and/or a vacuum.

In other embodiments, the first protective film 22 may be attached to the front side 2 of the wafer W so that, in the entire region where the front surface 24 of the first protective film 22 is in contact with the front side 2, the front surface 24 is in direct contact with the front side 2. In this case, the first protective film 22 can be attached to the front side 2 by applying an external stimulus to the first protective film 22, as has been detailed above.

In other embodiments, a cushioning layer (not shown) may be attached to the back surface 28 of the first protective film 22 opposite to the front surface 24 thereof, as has been described in detail above. A base sheet (not shown) may be attached to a back surface of the cushioning layer, as has also been detailed above.

Figure 11:
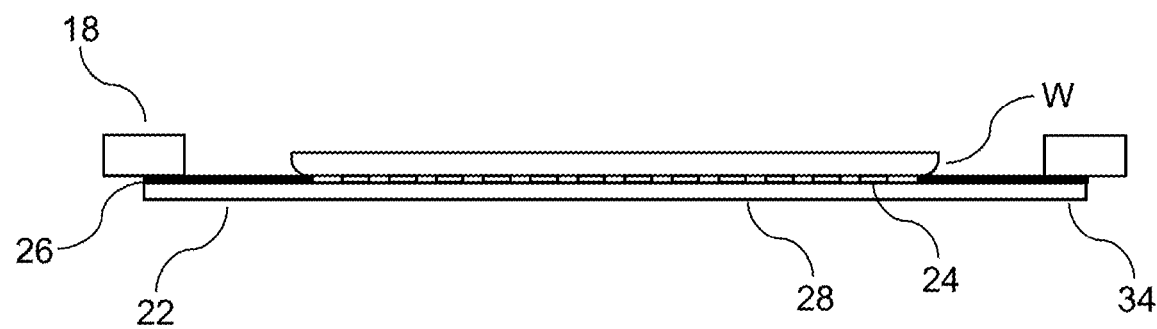
FIG. 11 is a cross-sectional view showing the outcome of a step of grinding the wafer according to the third embodiment of the method of the present invention.

Subsequently, as an optional step, the back side 4 of the wafer W is ground for adjusting the wafer thickness, e.g., by using a conventional grinding apparatus (not shown). The outcome of this grinding step is shown in FIG. 11. After the grinding step, optionally, the wafer back side 4 may be subjected to polishing, e.g., dry polishing, and/or etching, e.g., plasma etching.

Figure 12:
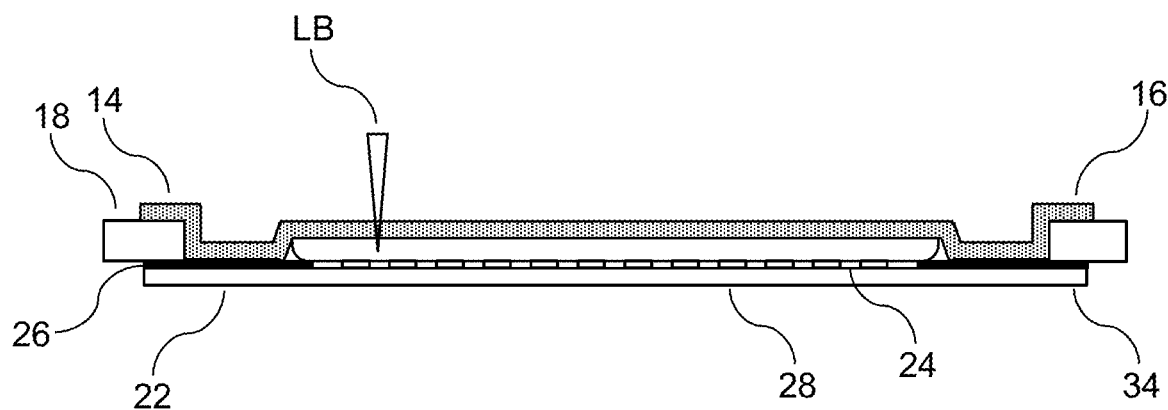
FIG. 12 is a cross-sectional view showing the outcome of a step of attaching a second protective film to the wafer and illustrating a step of applying a laser beam to the wafer according to the third embodiment of the method of the present invention.

Then, the second protective film 14 is attached to the ground and, optionally, polished and/or etched back side 4 of the wafer W. The outcome of this attachment step is shown in FIG. 12. The material and the thickness of the second protective film 14 used in the method of the third embodiment may be the same as those of the second protective film 14 used in the methods of the first and second embodiments.

The second protective film 14 has a substantially circular shape and an outer diameter which is larger than the outer diameter of the wafer W. The second protective film 14 is attached to the back side 4 of the wafer W in the same manner as in the method of the first embodiment. Further, the outer peripheral portion 16 of the second protective film 14 is attached to the annular frame 18, for example, by means of an adhesive (not shown). Thus, the second protective film 14 is attached to the same annular frame 18 as the first protective film 22. Alternatively, the second protective film 14 may be attached to a different annular frame (not shown).

The first protective film 22 and the second protective film 14 are attached to each other by means of the adhesive layer 26 so as to enclose the wafer W between the first protective film 22 and the second protective film 14 (see FIG. 12). The adhesive layer 26 thus forms a seal around the outer circumference of the wafer W.

In other embodiments, no adhesive layer may be provided on the front surface 24 of the first protective film 22, at least in the region where the front surface 24 of the first protective film 22 comes into contact with the second protective film 14. In this case, the first protective film 22 may be attached to the second protective film 14 by means of an adhesive layer (not shown) provided on the front surface 20 of the second protective film 14.

The second protective film 14 may be attached to the first protective film 22 and to the annular frame 18 during or after attaching the second protective film 14 to the wafer W.

Figure 13:
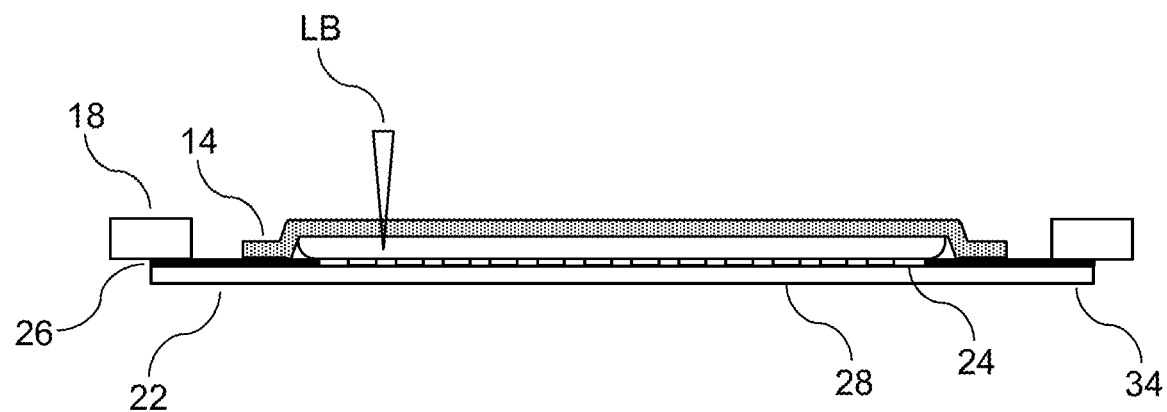
FIG. 13 is a cross-sectional view showing the outcome of a step of attaching a second protective film to the wafer and illustrating a step of applying a laser beam to the wafer according to a modification of the third embodiment of the method of the present invention.
Figure 14:
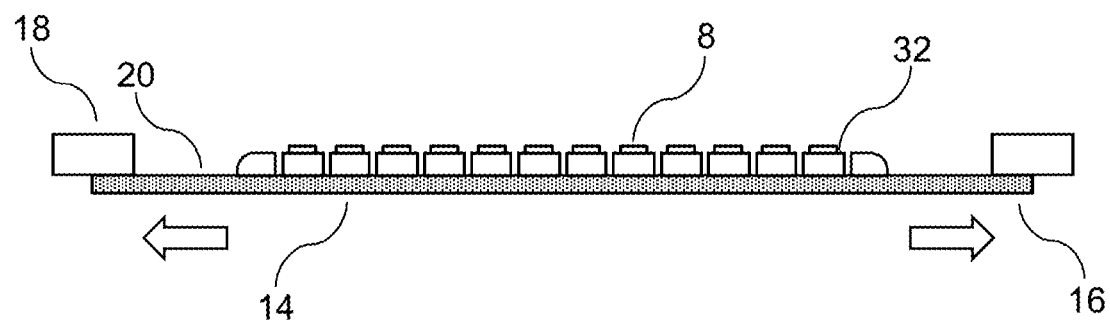
FIG. 14 is a cross-sectional view illustrating a step of radially expanding the second protective film, so as to separate devices of the wafer from each other, according to the third embodiment of the method of the present invention.

FIG. 13 is a cross-sectional view showing the outcome of a step of attaching the second protective film 14 to the wafer W according to a modification of the third embodiment of the method of the present invention. In this modified method, the second protective film 14 has a reduced outer diameter which does not extend to the annular frame 18. However, also in this modified embodiment, the first protective film 22 and the second protective film 14 are attached to each other by means of the adhesive layer 26 so as to enclose the wafer W between the first protective film 22 and the second protective film 14.

After attaching the first and second protective films 22, 14 to the wafer W, the laser beam LB is applied to the wafer W from the back side 4 thereof in the same manner as in the method of the first embodiment, as is illustrated in FIGS. 12 and 13. The laser beam LB is applied to the wafer W in a plurality of positions along the division lines 12 so as to form a plurality of modified regions (not shown) in the wafer W along the division lines 12.

After the modified regions have been formed in the wafer W, the first protective film 22 is removed from the front side 2 of the wafer W. Subsequently, the wafer W is divided into individual dies 32 in the same manner as in the method of the first embodiment, i.e., by radially expanding the second protective film 14, as is indicated by two arrows in FIG. 14. The resulting dies 32 can be picked up directly from the second protective film 14, e.g., by using a conventional pick-up device (not shown).

Figure 15:
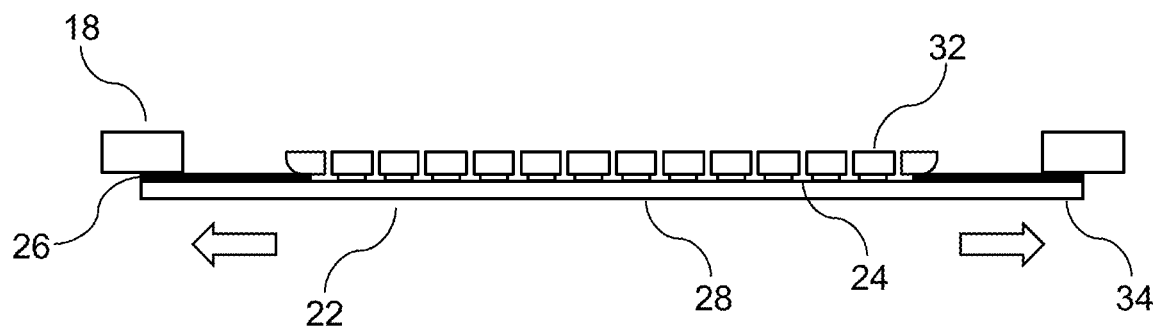
FIG. 15 is a cross-sectional view illustrating a step of radially expanding the first protective film, so as to separate devices of the wafer from each other, according to a modification of the third embodiment of the method of the present invention.

FIG. 15 is a cross-sectional view illustrating a modification of the third embodiment of the method of the present invention. In this modified method, after forming the modified regions in the wafer W, the first protective film 22 remains on the wafer W and the second protective film 14 is removed therefrom. Subsequently, the first protective film 22, which is an expandable film, is radially expanded, as is indicated by two arrows in FIG. 15, e.g., by moving the annular frame 18 and an expansion drum (not shown) relative to each other in a conventional manner. By radially expanding the first protective film 22, an external force is applied to the wafer W, thus dividing the wafer W along the division lines 12 where the wafer strength has been reduced due to the presence of the modified regions. In this way, the fully separated dies 32 are obtained. After dividing the wafer W in this manner, the resulting dies 32 can be picked up directly from the first protective film 22, e.g., by using a conventional pick-up device (not shown).

The modified approach illustrated in FIG. 15 can be adopted in a particularly advantageous manner, for example, if the first protective film 22 has been attached to the front side 2 of the wafer W by applying an external stimulus, such as heat and/or pressure and/or a vacuum, to the first protective film 22, as has been detailed above. Also, this approach can be used, e.g., if the second protective film 14 has a configuration as shown in FIG. 13, i.e., a reduced outer diameter which does not extend to the annular frame 18.

Figure 16:
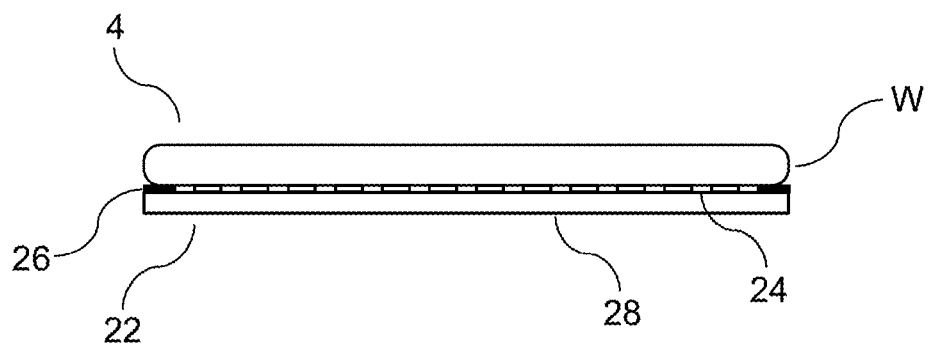
FIG. 16 is a cross-sectional view showing the outcome of a step of cutting the first protective film attached to the wafer according to a modification of the third embodiment of the method of the present invention.
Figure 17:
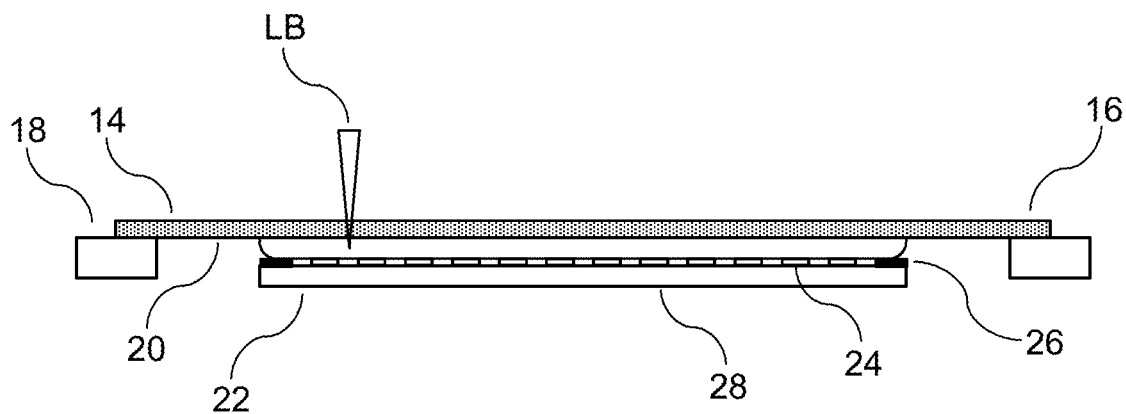
FIG. 17 is a cross-sectional view showing the outcome of a step of grinding the wafer, showing the outcome of a step of attaching a second protective film to the wafer and illustrating a step of applying a laser beam to the wafer according to the modification of the third embodiment of the method of the present invention.

Further possible modifications of the third embodiment of the method of the present invention are illustrated in FIGS. 16 and 17. In particular, after attaching the first protective film 22 to the wafer W (see FIG. 10), the first protective film 22 may be cut so that the resulting outer diameter of the first protective film 22 is substantially the same as the outer diameter of the wafer W (see FIG. 16). Subsequently, optionally, the back side 4 of the wafer W may be ground for adjusting the wafer thickness, e.g., by using a conventional grinding apparatus (not shown). After the grinding step, optionally, the wafer back side 4 may be subjected to polishing, e.g., dry polishing, and/or etching, e.g., plasma etching.

Then, the second protective film 14 is attached to the ground and, optionally, polished and/or etched back side 4 of the wafer W. The outcome of this attachment step, which may be carried out in the same manner as detailed above, is shown in FIG. 17. As is also illustrated in this latter drawing, after attaching the second protective film 14 to the wafer W, the laser beam LB is applied to the wafer W from the back side 4 thereof in a plurality of positions along the division lines 12 so as to form a plurality of modified regions (not shown) in the wafer W along the division lines 12.

After the modified regions have been formed in the wafer W, the first protective film 22 is removed from the front side 2 of the wafer W. Subsequently, the wafer W is divided into the individual dies 32 by radially expanding the second protective film 14. The resulting dies 32 can be picked up directly from the second protective film 14, e.g., by using a conventional pick-up device (not shown). The steps of applying the laser beam LB to the wafer W, removing the first protective film 22 from the wafer W and dividing the wafer W into the individual dies 32 can be performed in the same manner as detailed above for the method of the third embodiment.

The invention claimed is:

1. A method of processing a substrate, having on one side a device area with a plurality of devices, wherein the method comprises:
   providing a first protective film;
   providing a second protective film;
   attaching the first protective film to the one side of the substrate, so that at least a central area of a front surface of the first protective film is in direct contact with the one side of the substrate;
   after attaching the first protective film to the one side of the substrate, placing the substrate, having the first protective film attached thereto, on a support;
   attaching the second protective film to a side of the substrate being opposite to the one side; and
   after attaching the second protective film to the side of the substrate being opposite to the one side, applying a laser beam to the substrate from the side of the substrate being opposite to the one side, wherein
   the substrate is made of a material which is transparent to the laser beam,
   the second protective film is made of a material which is transparent to the laser beam, and
   the laser beam is applied to the substrate in a plurality of positions so as to form a plurality of modified regions in the substrate.

2. The method according to claim 1, wherein attaching the first protective film to the one side of the substrate comprises:
   applying the first protective film to the one side of the substrate, so that at least the central area of the front surface of the first protective film is in direct contact with the one side of the substrate; and
   applying an external stimulus to the first protective film during and/or after applying the first protective film to the one side of the substrate, so that the first protective film is attached to the one side of the substrate.

3. The method according to claim 2, wherein applying the external stimulus to the first protective film comprises applying pressure to the first protective film and/or heating the first protective film and/or cooling the first protective film and/or applying a vacuum to the first protective film and/or irradiating the first protective film with light.

4. The method according to claim 1, wherein
   at least one division line is formed on the one side of the substrate, and the laser beam is applied to the substrate in a plurality of positions along the at least one division line so as to form a plurality of modified regions in the substrate along the at least one division line.

5. The method according to claim 1, further comprising: attaching the first protective film to the second protective film so as to enclose the substrate between the first protective film and the second protective film.

6. The method according to claim 1, wherein the second protective film is attached to the side of the substrate being opposite to the one side so that at least a central area of a front surface of the second protective film is in direct contact with the side of the substrate being opposite to the one side.

7. The method according to claim 1, wherein
the first protective film is provided with an adhesive layer,
the adhesive layer is provided only in a peripheral area of the front surface of the first protective film, the peripheral area surrounding the central area of the front surface of the first protective film, and
the first protective film is attached to the one side of the substrate so that the adhesive layer comes into contact only with a peripheral portion of the one side of the substrate.

8. The method according to claim 1, wherein a cushioning layer is attached to a back surface of the first protective film opposite to the front surface thereof.

9. The method according to claim 8, wherein a base sheet is attached to a back surface of the cushioning layer.

10. The method according to claim 1, wherein
the second protective film is expandable, and
the method further comprises, after applying the laser beam to the substrate from the side of the substrate being opposite to the one side, radially expanding the second protective film so as to separate the devices from each other.

11. The method according to claim 1, wherein
the first protective film is expandable, and
the method further comprises, after applying the laser beam to the substrate from the side of the substrate being opposite to the one side, radially expanding the first protective film so as to separate the devices from each other.

12. The method according to claim 1, further comprising: attaching the first protective film and/or the second protective film to an annular frame.

13. The method according to claim 1, further comprising: removing the first protective film from the one side of the substrate.

* * * * *